(12) United States Patent
Hector et al.

(10) Patent No.: US 7,282,307 B2
(45) Date of Patent: Oct. 16, 2007

(54) REFLECTIVE MASK USEFUL FOR TRANSFERRING A PATTERN USING EXTREME ULTRA VIOLET (EUV) RADIATION AND METHOD OF MAKING THE SAME

(75) Inventors: Scott D. Hector, Austin, TX (US); Sang-In Han, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 491 days.

(21) Appl. No.: 10/872,057

(22) Filed: Jun. 18, 2004

(65) Prior Publication Data

US 2005/0282072 A1 Dec. 22, 2005

(51) Int. Cl.
*G03F 1/00* (2006.01)
(52) U.S. Cl. .......................................................... 430/5
(58) Field of Classification Search ................... 430/5; 403/322, 323; 378/34, 35
See application file for complete search history.

(56) References Cited

U.S. PATENT DOCUMENTS

| | | |
|---|---|---|
| 6,596,465 B1 | 7/2003 | Mangat |
| 6,641,959 B2 | 11/2003 | Yan |
| 6,653,053 B2 | 11/2003 | Mangat |
| 6,673,520 B2 | 1/2004 | Han |
| 6,905,801 B2 * | 6/2005 | Liang et al. ................. 430/5 |
| 6,986,971 B2 * | 1/2006 | Han et al. .................... 430/5 |
| 7,090,948 B2 * | 8/2006 | Rau ............................. 430/5 |

OTHER PUBLICATIONS

Chovino et al., "EUV Mask Making: An Approach Based on the Direct Patterning of the EUV Reflector," Proceedings of SPIE, vol. 5256, 23$^{rd}$ Annual Bacus Symposium on Photomask Technology, 2003, pp. 566-572.
Han et al, "Development of Phase Shift Masks for Extreme Ultra Violet Lithography and Optical Evaluation of Phase Shift Materials." Proc of SPIE vol. 5374, 2004, 10 pgs.
Deng et al., "Rigorous EM Simulation of the Influence of the Structure of Mask Patterns on EUVL Imaging," Emerging Lithographic Technologies VII, Proceedings of SPIE vol. 5037, 2003, pp. 302-313.
Han et al., "Design and Method of Fabricating Phase Shift Masks for Extreme Ultraviolet Lithography by Partial Etching into the EUV Multilayer Mirror," Emerging Lithographic Technologies VII, Proceedings of SPIE vol. 5037, 2003, pp. 314-330.

* cited by examiner

*Primary Examiner*—S. Rosasco
(74) *Attorney, Agent, or Firm*—Susan C. Hill; Kim-Marie Vo

(57) ABSTRACT

An EUV mask (10, 309) includes an opening (26) that helps to attenuate and phase shift extreme ultraviolet radiation using a subtractive rather than additive method. A first embedded layer (20) and a second embedded layer (21) may be provided between a lower multilayer reflective stack (14) and an upper multilayer reflective stack (22) to ensure an appropriate and accurate depth of the opening (26), while allowing for defect inspection of the EUV mask (10, 309) and optional defect repair. An optional ARC layer (400) may be deposited in region (28) to reduce the amount of reflection within dark region (28). Alternately, a single embedded layer of hafnium oxide, zirconium oxide, tantalum silicon oxide, tantalum oxide, or the like, may be used in place of embedded layers (20, 21). Optimal thicknesses and locations of the various layers are described.

24 Claims, 4 Drawing Sheets

REFLECTIVE MASK USEFUL FOR TRANSFERRING A PATTERN USING EXTREME ULTRA VIOLET (EUV) RADIATION AND METHOD OF MAKING THE SAME

RELATED APPLICATIONS

This application is related to U.S. Pat. No. 6,653,053 issued Nov. 25, 2003, entitled "Method of Forming a Pattern on a Semiconductor Wafer Using an Attenuated Phase Shifting Reflective Mask" and assigned to the current assignee hereof. This application is related to U.S. Pat. No. 6,673,520 issued Jan. 6, 2004, entitled "Method of Making an Integrated Circuit Using a Reflective Mask" and assigned to the current assignee hereof and incorporated herein by reference. This application is related to U.S. Pat. No. 6,596,465 issued Jul. 22, 2003, entitled "Method of Manufacturing a Semiconductor Component" and assigned to the current assignee hereof and incorporated herein by reference. This application is related to U.S. patent application Ser. No. 10/290,693 filed Nov. 8, 2002, entitled "Reflective Mask Useful for Transferring a Pattern Using Extreme Ultraviolet (EUV) Radiation and Method of Making the Same" and assigned to the current assignee hereof and incorporated herein by reference. This application is related to U.S. patent application Ser. No. 10/688,589 filed Oct. 16, 2003, entitled "Attenuated Phase Shift Mask for Extreme Ultraviolet Lithography and Method Therefore" and assigned to the current assignee hereof.

FIELD OF THE INVENTION

The invention relates, generally, to semiconductor manufacturing and more particularly to extreme ultra-violet (EUV) lithography.

BACKGROUND OF THE INVENTION

Currently, transmission optical photolithography is used to form patterned layers in semiconductor manufacturing. Since the ability to resolve the semiconductor device features during photolithography is directly proportional to the wavelength of the light source, the wavelength of the light source needs to decrease as device dimensions decrease. To pattern device dimensions less than approximately 70 nanometers (nm), one option is to use a light source with a wavelength in the extreme ultra-violet (EUV) regime. As used herein, the EUV regime has a characteristic wavelength between approximately 4-25 nanometers and more specifically, between 13-14 nanometers. Since it is difficult to find a material that transmits EUV radiation when exposed to wavelengths in the EUV regime, EUV lithography operates in a reflective mode as opposed to the transmission mode. Hence, EUV masks are reflective in nature and are not transmissive like the masks for optical photolithography or other technology options such as electron projection lithography or ion projection lithography.

Typically, an additive process is performed to fabricate an EUV mask. In this process, layers are formed and patterned over a reflective layer, which is formed on a mask substrate. Each additional layer that is formed and patterned requires deposition and patterning processes that increase the complexity of manufacturing the EUV mask. Thus, a need exists for an EUV mask that is capable of patterning small device features on a semiconductor wafer that is formed by a simplified manufacturing process.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
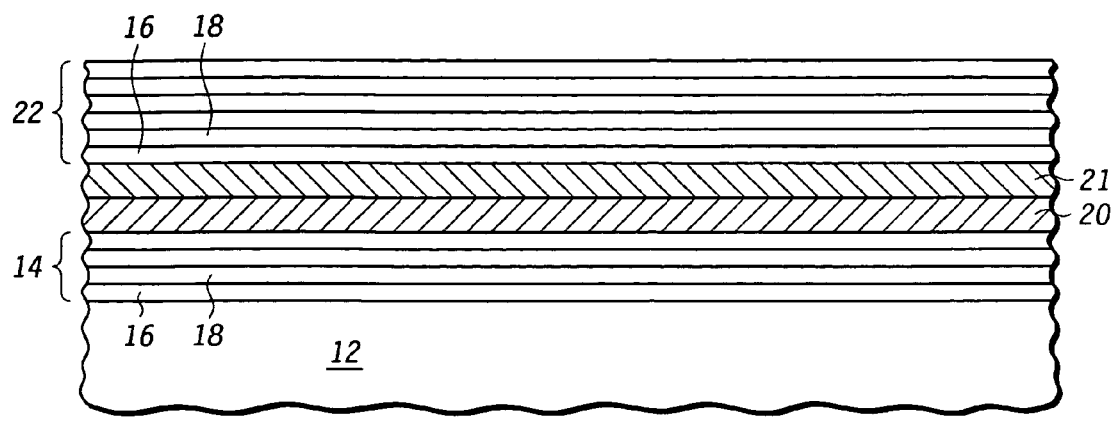
FIG. 1 illustrates a portion of an EUV mask substrate having a lower multilayer reflective stack, a plurality of embedded layers, and an upper multilayer reflective stack in accordance with an embodiment of the present invention.

Instead of forming and patterning multiple layers over a reflective layer on a mask substrate (i.e., an additive mask fabrication process) to manufacture an EUV mask, it is desirable to pattern the reflective layer itself (i.e., a subtractive process). In a preferred embodiment, the reflective layer is a multilayer reflective stack of alternating materials. To pattern the reflective layer, an embedded layer used for etch stop purposes (EL 21), see FIG. 1, is embedded within the reflective layer. The reflective layer is patterned and etched to form an opening using a chemistry that is selective to the EL 21. Hence, the EL 21 is exposed once the opening is formed.

Both the HPSMs (hard phase shift masks) and the APSMs (attenuated phase shift masks) are reflective masks that utilize the phase information of light during exposure in a lithographic process. However, each of the APSM and HPSM form patterns using different parameters of light and thus, each mask has its own unique lithographic applications. The APSM forms a pattern that has dark regions that block light, bright regions that reflect light, and an absorber region that is 180 degrees out of phase with the light reflected from the bright regions. Since some light is reflected from the absorber region, this small intensity of light destructively interferes with the unshifted light reflected from the reflective region, thereby creating a sharper image to be patterned. The APSM mask has advantages in printing isolated spaces or contact holes, instead of lines.

The HPSM uses destructive interference at the boundaries of two regions, which are designed so that light from each region is 180 degrees out of phase with each other, to provide contrast to form a pattern in a photoresist layer. It is desirable to use the HPSM to print dense lines or repetitive structures and very small isolated lines, which all require an obstruction of light during exposure. For an ideal situation, the ratio of the light intensity between the two regions, is 1, meaning both are equally bright. In reality, the ratio could be less than 1. For example, a ratio of 0.85 is still effective for printing.

First, a method for forming the HPSM will be described in regards to FIGS. 1-6 and how to use the HPSM to form a semiconductor device will be explained in regards to FIG. 6. Next, any changes to the process for forming an HPSM that are employed to form the APSM, will be described. In addition, using the APSM to form a semiconductor device will be discussed in regards to FIG. 7. However, both the APSM and HPSM are formed using a process with one or more embedded layers (ELs) 20, 21.

Shown in FIG. 1 is the starting point for forming an EUV (reflective) mask 10, such as the HPSM 10, which includes a (mask) substrate 12, a lower reflective stack 14, a first embedded layer (EL) 20, a second embedded layer (EL 21), and an upper reflective stack 22. In one embodiment, the substrate 12 is a low thermal expansion (LTE) material, which as used herein has (i) a coefficient of thermal expansion (CTE) of less than approximately 30 parts per million (ppm) per degree Kelvin between 19 and 23 degrees Celsius; (ii) a low defect density, which used herein is approximately less than 0 defects greater than approximately 50 nanometers Poly Styrene Latex (PSL) sphere equivalent and (iii) a low surface roughness, which used herein is less than approximately 50 nanometers flatness measured from a peak of a bump to a valley between the bump and an adjacent bump. In addition, the substrate 12 should be able to mechanically support any overlying layers during the manufacturing process of the mask and the fabrication process of the semiconductor device. In some embodiments, the mask substrate is a high quality ceramic, fused silica or another glass.

The lower reflective stack 14 is a reflective layer and in a preferred embodiment, has alternating layers of at least two different materials. Of the two different materials chosen, one should be highly transmissive to the wavelength of radiation incident on the HPSM 10 during a lithographic process, and the other material should have an index of refraction different than that of the highly transmissive layer. The thickness and index of refraction of the pair of materials should be chosen to have the peak reflectivity for the wavelength of the EUV source. In one embodiment, the first alternating layer 16 is molybdenum and the second alternating layer 18 is silicon or vice versa for a radiation with a wavelength of 13.4 nanometers. In a preferred embodiment, the molybdenum is in contact with the substrate 12 so that the topmost layer of all the layers of a combined reflective stack is silicon (to be described in more detail below). In another embodiment, molybdenum and beryllium are used for the first alternating layer 16 and the second alternating layer 18 for radiation with a wavelength of 11.4 nanometers. In an alternate embodiment, lower reflective stack 14 may have three or more layers of at least two different materials which are repeated in order to form reflective stack 14.

The upper reflective stack 22 is also a reflective layer, which in a preferred embodiment is a multilayer stack having alternating layers of at least two different materials. Preferably, the upper reflective stack 22 includes the first alternating layer 16 and the second alternating layer 18, which, in one embodiment, are molybdenum and silicon. However, the materials used for the upper multilayer reflective stack do not have to be the same materials used for the lower multilayer reflective stack. In an alternate embodiment, upper reflective stack 22 may have three or more layers of at least two different materials which are repeated in order to form reflective stack 22. Silicon is desired to be the exposed layer of the combined reflective stack because the native silicon oxide layer that is formed does not undesirably absorb as much EUV light as molybdenum oxide, which inherently forms when molybdenum is exposed to an oxygen-containing environment. Furthermore, the preference of silicon dioxide to molybdenum oxide as the top layer has manufacturing advantages as well. Silicon dioxide on the surface of the silicon capping layer can be easily incorporated into the mask fabrication process or can be easily removed from the surface revealing fresh silicon surface by using well established fabrication processes such as wet or dry etching of silicon dioxide. However, if molybdenum is the topmost layer of the combined mask, an additional process is needed to form a capping layer over the molybdenum to prevent oxidation. Alternately, a capping layer may also be desirable even when silicon is the topmost layer of the combined mask.

In a preferred embodiment, the lower reflective stack 14 and the upper reflective stack 22 together include a total of 40 layer pairs (periods) of a silicon layer and a molybdenum layer with a periodicity of about 7 nm, wherein a molybdenum layer is in contact with the substrate 12 and a silicon layer is the top layer of the upper multilayer reflective stack 22. The total number of layer pairs may exceed 40, but increasing the number of layer pairs greater than 40 provides diminishingly less improvement in optical performance of the multilayer stack. Additionally, a combined reflective stack, which includes the upper reflective stack 22 and the lower reflective stack 14, with less than 40 layer pairs may not have adequate reflectivity. In a preferred embodiment, the combined reflective stack 14 and 22 reflects at least 65% of incident light at a wavelength of 13-14 nm. For the fabrication of the combined reflective stack 14 and 22, ion beam deposition (IBD), magnetron sputtering, E-beam evaporation or the like can be used.

The EL 20 and EL 21 are formed between the lower reflective stack 14 and the upper reflective stack 22. In other words, the EL 20 and 21 are embedded layers within the combined reflective stack 14 and 22. The number of periods in the lower reflective stack 14 and the upper reflective stack 22 is determined based on the reflectivity and desired amount of phase shifting of the combined EL 20 and 21, as will be further explained below. The EL 20 should have a high transmission of the wavelength of radiation to be used in the EUV lithographic process and a high etch selectivity to the material chosen for EL 21. EL 21 should have a high etch selectivity to the upper multilayer reflective stack 22 for both the etching process used to form region 26 and for the repair etching process used to remove defect 19. It is probable that the EL 20 will absorb some EUV radiation and therefore decrease the overall reflectivity of the lower multilayer reflective stack 14. However, the reflectivity of the upper multilayer reflective stack 22 can be maintained as high as that from the combined multilayer stack, 14 and 22, without ELs 20 and 21 by controlling the thickness of EL 20 and 21. For a certain type of APSM, the thickness of EL 20 and 21 can be controlled to achieve specific reflectivity ratio between the EUV radiation reflected from regions 28 and region 30. In one embodiment, the EL 20 includes ruthenium, hafnium oxide, boron carbide, zirconium, zirconium oxide, tantalum oxide, tantalum silicon oxide, tantalum silicon oxynitride, the like, or combinations of the above formed by physical vapor deposition (PVD) (e.g., magnetron sputtering, ion beam sputtering), chemical vapor deposition (CVD), plasma-enhanced chemical vapor deposition (PECVD), the like, or combinations of the above processes. Similarly, in one embodiment, the EL 21 includes an alloy of nickel and iron, hafnium oxide, chromium, chromium nitride, chromium oxide, zirconium, zirconium oxide, tantalum nitride, the like, or combinations of the above formed by physical vapor deposition (PVD) (e.g., magnetron sputtering, ion beam sputtering), chemical vapor deposition (CVD), plasma-enhanced chemical vapor deposition (CVD), the like, or combinations of the above processes.

Note that for one embodiment of the present invention, a single embedded layer of hafnium oxide, zirconium oxide, tantalum silicon oxide, tantalum oxide, or the like, may be used in place of embedded layers 20 and 21. Alternately, either one or both of embedded layers 20 and 21 may be formed of hafnium oxide, zirconium oxide, tantalum silicon oxide, tantalum oxide, or the like. These materials have the advantage of having high transparency at the wavelengths used for defect inspection of mask 10 (see FIG. 6) and mask 309 (see FIG. 7). These materials also have high selectivity to the etch process used to form region 26. Any single material may be used to replace embedded layers 20 and 21 if that material has the advantage of having high transparency at the wavelengths used for defect inspection of masks 10 and/or 309, and also has the advantage of having high selectivity to the etch process used to form region 26.

The sum of the thickness values of the EL 20 and EL 21 ($t_{EL20}+t_{EL21}$) is determined using a calculation based on electromagnetic wave theory. EUV radiation incident on the HPSM 10 is composed of electromagnetic waves. These waves are represented by electric and magnetic fields. When the electromagnetic waves are incident on an interface between two materials, such as the layers in the upper reflective stack 22 and the lower reflective stack 14, some of the incident radiation is reflected at the interface. The amount of radiation reflected can be calculated by determining the Fresnel coefficients at the interface between the two materials, as described in David Attwood, "Soft X-Rays and Extreme Ultraviolet Radiation", Cambridge University Press, 1999, Chapters 3 and 4. The Fresnel coefficients depend on the index of refraction of the two materials and the angle of incidence of the radiation. In the EUV spectrum, the index of refraction of materials can be calculated using quantum mechanical theory and researchers have tabulated the index of refraction values for most known elements, which can be found in B. L. Henke, E. M. Gullikson, and J. C. Davis, "X-Ray Interactions: Photoabsorption, Scattering, Transmission, and Reflection at E=50-30,000 eV, Z=1-92," Atomic Data and Nuclear Data Tables, volume 54, page 181, 1993.

If the combined reflective stack 14 and 22 is or is approximately to be one or two layers, the reflectivity of the radiation incident on the stack of materials that exists on the HPSM 10 can be calculated at each interface using the Fresnel coefficients for that interface. In propagation to each interface, some of the radiation is absorbed, depending on how far the radiation has traveled through the stack of materials. The amount of radiation absorbed can be determined using the extinction coefficients for the materials in the combined reflective stack 14 and 22. The extinction coefficients for most elements are also tabulated and can be found in Henke et al.'s publication listed above. The radiation reflected from each interface propagates back toward the top of the stack of layers, and some is absorbed. Some of the radiation is also reflected at the interfaces it encounters in propagating back to the surface of the stack. To determine the total amount of radiation reflected by the stack of layers, the amount reflected at each interface that is not absorbed or reflected in propagating back to the surface of the stack of layers is determined.

The phase at the surface of the stack of materials of the radiation reflected from each interface is also determined using electromagnetic wave theory, the index of refraction of the materials in the stack, and the distance the wave traveled in each material. Electromagnetic waves constructively interfere when their phase is identical, and they destructively interfere when their phase differs by 180 degrees. They partially interfere when their phase difference is in between 0 and 180 degrees. The amount of interference is in proportion to the cosine of the difference in their phase. The total reflectivity of the stack of materials is determined by adding the amount of radiation reflected at each interface that also is not absorbed or reflected in returning to the surface of the stack. This addition also accounts for the phase of the radiation reflected at each interface.

However, in practice the combined reflective stack 14 and 22 and the EL 20 and 21 are many layers; thus, a different approach should be taken to better calculate the reflectivity and phase of the EUV mask. In principle for the case of HPSM design where the EL 20 and 21 need to be transparent to the incident EUV radiation, the sum of the thickness values of the EL 20 and EL 21 is approximately the same as the periodicity of the molybdenum and silicon pairs which is about 7 nanometers in one embodiments. The sum of the thickness values of the EL 20 and EL 21 ($t_{EL20}+t_{EL21}$) is described by the equation below, which takes into account only a single ray of radiation reflected from a single layer:

$$t_{EL20}+t_{EL21} \cong (\lambda * \cos\theta)/(2 * n_{\it eff}) \quad \text{(equation 1)}$$

wherein $\lambda$ is the wavelength of radiation of the EUV lithographic process, $n_{\it eff}$ is the effective index of refraction of the two materials which is more like the average of the index of refraction of the EL 20 ($n_{EL20}$) and the index of refraction of the EL 21($n_{EL21}$), $\theta$ is the angle of incidence of the radiation incident on the mask with respect to the perpendicular axis. Since in reality the light incident on the HPSM 10 is reflected back by many layers (i.e., the layers in the combined reflective layer 14 and 22 and the EL 20 and EL 21), a matrix method can be used to calculate the reflectivity and phase shifting of the combined reflective layer 14 and 22, EL 20, and EL 21. To easily handle the matrix algebra it is desirable to use a computer program. The combined reflective layer 14 and 22 along with EL 20 and EL 21 includes N layers, wherein each of the N layers has a thickness denoted as d1, d2, d3, . . . dN that is used in the equation 2. In physical structure, d1 is the thickness of the topmost layers and dN is that of the bottom most layers on the EUV mask substrate 12.

$$\begin{bmatrix} E(0) \\ H(0) \end{bmatrix} = [M_1(d1)][M_2(d2)][M_3(d3)] \bullet \bullet \quad \text{(equation 2)}$$
$$[M_N(dN)]\begin{bmatrix} E(d1+d2+d3\ldots dN) \\ H(d1+d2+d3\ldots dN) \end{bmatrix}$$
$$= [M_x(d_x)]\begin{bmatrix} E(d1+d2+d3\ldots dN) \\ H(d1+d2+d3\ldots dN) \end{bmatrix},$$

wherein each matrix $[M_x(d_x)]$, where x is 1, 2, 3, . . . N, is:

$$[M_x(d_x)] = \begin{bmatrix} \cos\beta_x d_x & i\frac{1}{g_x}\sin\beta_x d_x \\ ig_x\sin\beta_x d_x & \cos\beta_x d_x \end{bmatrix} \quad \text{(equation 3)}$$

β is the propagation constant (2πn/λ) in the medium with an index of refraction n and g is the intrinsic admittance of the material $$(\sqrt{\frac{\varepsilon}{\mu}},$$

where ϵ is the electric permittivity of the layer and μ is permeability of the layer). A skilled artisan recognizes that i is used to denote a complex number, E is the electric field amplitude and H is the magnetic field amplitude.

Equations 2-3 assume that the light incident on the HPSM 10 is incident normal to the HPSM 10. However, if the light is incident on the combined reflective stack 14 and 22 at an oblique angle ϕ, the characterization matrix of equation 3 needs to be modified due to optical path length difference for different states of polarization. For s-polarization, meaning the orientation of the electric field is perpendicular to the plane of the incident light, the intrinsic admittance g and the propagation constant β need to be replaced in equations 2 and 3 by gcosϕ and βcosϕ, respectively. For p-polarization, where the orientation of electric field is in the same plane as the incident light, intrinsic admittance g and the propagation constant β need to be replaced in equations 2 and 3 by g/cosϕ and βcosϕ, respectively. In the preferred embodiment, the angle of the incident light is 5 degrees from the normal to the HPSM 10 based on the tool configuration as will be described in regards to FIGS. 6 and 7. Since the angle is close to zero there is not much difference between the calculations when the radiation is perpendicular to the HPSM 10 and for the preferred embodiment, where the radiation is 5 degrees normal to the HPSM 10.

By solving for the characterization matrix of the combined reflective stack 14 and 22 and EL 20 and EL 21, the reflection coefficient, from which reflectivity and phase angle is determined, is calculated. The result of equation 2, is a two by two matrix, [M], represented as:

$$[M] = \begin{bmatrix} m_{11} & m_{12} \\ m_{21} & m_{22} \end{bmatrix}, \quad \text{(equation 4)}$$

From [M], the reflection coefficient r can be determined using:

$$r = \frac{\frac{1}{g_s}m_{11} + m_{12} - \frac{1}{g_o g_s}m_{21} - \frac{1}{g_o}m_{22}}{\frac{1}{g_s}m_{11} + m_{12} + \frac{1}{g_o g_s}m_{21} + \frac{1}{g_o}m_{22}}, \quad \text{(equation 5)}$$

where $g_o$ is the intrinsic admittance of the top material of the upper reflective stack 22 and $g_s$ is the intrinsic admittance of the bottom material of the lower reflective stack 14.

Once r is determined using equation 5, the reflectivity (or the power reflection coefficient) can be calculated as the square of the absolute value of the complex form of the reflective coefficient r using time averaged Poynting vectors for the incident and the reflected waves (light):

$$R = \frac{(-\vec{z})\bullet\langle\vec{S_r}\rangle}{(\vec{z})\bullet\langle\vec{S_i}\rangle} = |r|^2 \quad \text{(equation 6)}$$

wherein $\vec{z}$ is the reference direction of the unit vector, $\vec{S_r}$ is the time averaged Poynting vector for the reflected light, and $\vec{S_i}$ is the time averaged Poynting vector for the incident light.

To determine the phase angle, the argument of the complex coefficient of the reflective coefficient can be determined since the reflective coefficient has a complex form. The argument of a complex coefficient is the calculation of angles of a complex number (i.e., the reflection coefficient) relative to the positive real axis in the complex plane.

The above equations are used to determine the thickness values of EL 20 and EL 21 and the location of the EL 20 and EL 21 (i.e., how many layers the upper reflective stack 22 and the lower reflective stack 14 include). In general, the optimum total thickness of EL 20 and EL 21 is smaller than the value calculated from equation 1 due to attenuation of wave amplitude when the EL 20 and EL 21 are beneath many layers of the upper multilayer stack 22. The thickness of the EL 20 and EL 21 are generally chosen to provide the maximum reflectivity when it is embedded inside the combined reflective stack 14 and 22; however, other characteristics besides reflectivity may be relevant in determining the thicknesses of the EL 20 and EL 21 layers.

One important purpose of EL 20 is to enhance contrast for defect inspection, which is performed by imaging in reflection mode at a different wavelength, $\lambda_d$. The inspection contrast is determined from the calculated reflectivity of regions 28 and 30 at the inspection wavelength, $\lambda_d$. The reflectivity of these regions 28 and 30 at the inspection wavelength—denoted $R_{28}(\lambda_d)$ and $R_{30}(\lambda_d)$, respectively—is calculated using the above equations where the values for n are determined by experimental measurements and its relationship with g. The inspection contrast is given by:

Contrast=abs $\{[R_{28}(\lambda_d)-R_{30}(\lambda_d)]/[R_{28}(\lambda_d)+R_{30}(\lambda_d)]\}$ (equation 7)

The operator abs refers to the absolute value. The thickness value of EL 20 may be determined to maximize contrast by an iterative procedure using the above equations. The thickness of the EL 21 may then be determined to provide the desired reflectivity at the EUV radiation wavelength for region 28 and 180 degrees of phase shift between the two regions, 28 and 30. The thickness values of EL 20 and EL 21 may be adjusted slightly from their optimal values determined using the above equations to maximize the etch selectivity of EL 21 to layer 22. In addition, thickness values of EL 20 and EL 21 may be adjusted for other purposes. In practice, the thickness of EL 21 may be increased slightly from the calculated value, and the thickness of EL 20 may be slightly decreased to ensure that EL 21 is thick enough to properly function as an etch stop layer. Some decrease in inspection contrast may therefore be traded for an increase in etch selectivity of EL 21 with respect to stack 22.

In one embodiment of HPSM 10, where boron carbide is chosen as EL 20, which has an index of refraction (n) of approximately 0.9643, the thickness of the EL 20 is calculated to be approximately 4 nanometers (nm), provided radiation with a wavelength of 13.4 nm and incident on the EUV mask at 5 degrees is used. In the same embodiment where an alloy of nickel and iron is chosen as EL 21, the thickness of EL 21 is calculated to be approximately 2.8 nm. Again, the actual thickness of EL 20 and EL 21 may be varied from these calculated values.

For one embodiment of HPSM 10, the main parameters to obtain are the thickness of the ELs 20 and 21 and the number of periods of the molybdenum and silicon pairs for the upper reflective stack 22. The number of periods for the lower reflective stack is set 40 to make the reflectivity in region 26 as reflective as possible. Using the above equations, a plot can be generated that shows the reflectivity of regions 28 in the case where 4 nm of boron carbide for the EL 20 and 2.8 nm of an alloy of nickel and iron for the EL 21 are embedded at different positions under the upper multilayer reflective stack 22. Based on the graph, it can be determined that 180 degrees of phase shift and minimum change in reflectivity of combined reflective stack (14, 22) is achieved when the EL 20 and EL 21 are embedded sixteen (16) periods from the top of the combined reflective stack 14, 22. As will be described in more detail below, the phase shift between region 28 and region 30 should be 180 degrees, because portions of the upper reflective stack 22 and EL 21 are removed in region 30 of HPSM 10 so that patterning using the EUV mask is successful (see FIG. 5). A skilled artisan should recognize that by using different parameters (materials, wavelengths, etc.), the number of periods in the upper reflective stack 22, the thickness of EL 20 and EL 21, etc. may vary from those provided herein.

The above equations can be performed manually or can be automated. In the latter embodiment, software can be developed that efficiently optimizes the thickness of various layers, the number of periods in the upper multilayer reflective stack 22, the thicknesses of the EL 20 and EL 21, the like, or combinations of the above.

Figure 2:
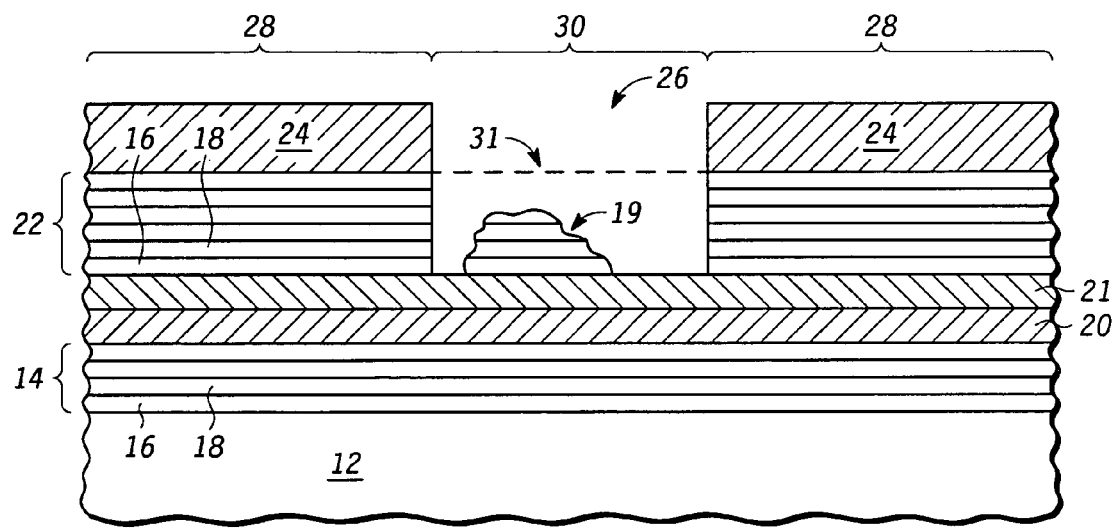
FIG. 2 illustrates the portion of the EUV mask of FIG. 1 after etching a portion of the upper multilayer reflective stack using a hard mask layer.

As shown in FIG. 2, after forming the lower reflective stack 14, the EL 20, the EL 21, and the upper reflective stack 22, an etch mask 24 is patterned to form an opening 26 in the upper reflective stack 22. In a preferred embodiment, the mask 24 is a hardmask of approximately 20 nm of chrome, ruthenium, any dielectric film formed by PVD, CVD, the like, or combinations of the above. Alternatively, the mask 24 can be photoresist, which may result in the sidewalls of the opening 26 to be sloped. However, a hardmask of chrome or another suitable material is preferred as to form substantially vertical sidewalls for the opening 26. Inspection and repair of the hardmask 24 can be done after the hardmask 24 has been etched by using standard etch gas mixture such as a mixture of chlorine and oxygen and before etching the upper reflective stack 22. Inspection and repair are processes that find and fix defects in the hardmask 24 to avoid the defects from being transferred to the upper reflective stack 22. After inspection and repair (if performed), the upper multilayer reflective stack 22 is patterned to form the opening 26, which stops on the EL 21, thereby exposing the EL 21 in the opening 26. In other words, the opening is formed partially through the combined reflective stack 14 and 22. A top plane 31 of the opening 26 is coplanar with the top surface of the combined reflective stack 14 and 22 and the bottom of the opening 26 is defined by the EL 21. In one embodiment, sulfur hexafluoride (SF$_6$) gas in a plasma environment is used to etch the molybdenum layers 16 and silicon layers 18 in the upper multilayer reflective stack 22. In a preferred embodiment, an inductively coupled plasma (ICP) etch process is used.

In the illustrated embodiment of FIG. 2, a defect 19 remains in opening 26, and thus repair is useful. In one embodiment of the present invention, repair may be performed by first finding any defects to be repaired. The use of imaging and reflected light may be used to locate defects to be repaired. Commercially available tools can perform this defect location function. Repair may then be performed using a focused electron beam in the presence of an etch gas (e.g. xenon dichloride or xenon difluoride). The energy of the electron beam may be between 0.5 KeV and 5.0 KeV. Alternate embodiments may perform repair using different gases, different energy levels, or a different process. Alternate embodiments of the present invention may not even perform repair, or may perform repair in an entirely different manner.

Figure 3:
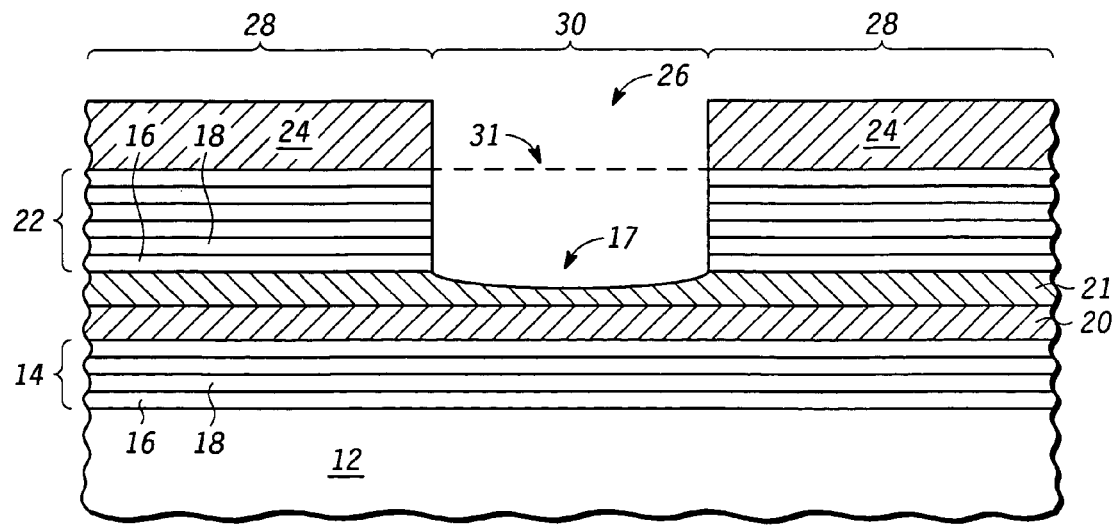
FIG. 3 illustrates the portion of the EUV mask of FIG. 2 after repairing by removing a defect.

Referring to FIG. 3, note that the repair process used to remove defect 19 (see FIG. 2) may also remove a portion of layer EL21 in opening 26 as illustrated by indentation 17.

Figure 4:
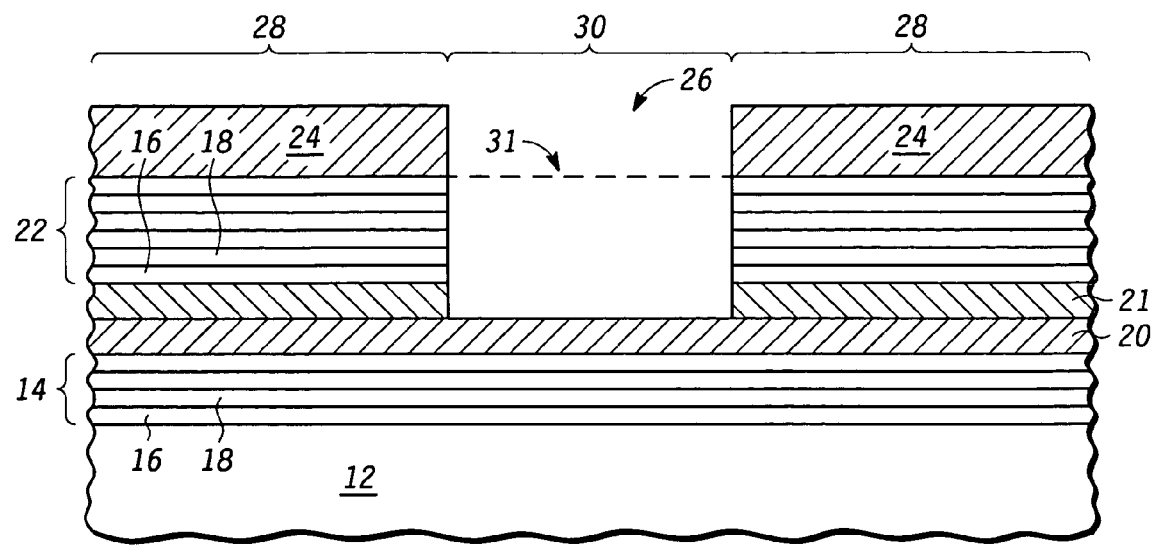
FIG. 4 illustrates the portion of the EUV mask of FIG. 3 after removing a portion of an embedded layer.

Referring to FIG. 4, the remaining portion of EL 21 in opening 26 has been removed using a wet etch or a dry etch (e.g. a plasma etch). The chemistry and conditions used for this etch process will vary depending upon the materials chosen for layers EL 20, EL 21, and stack 22. As one example, if EL 21 is an alloy of nickel and iron, and EL 20 is boron carbide, then a wet etch using dilute hydrochloric acid may be used to remove EL 21 in opening 26. Alternatively, a wet etch using an amine based solution may be used.

Figure 5:
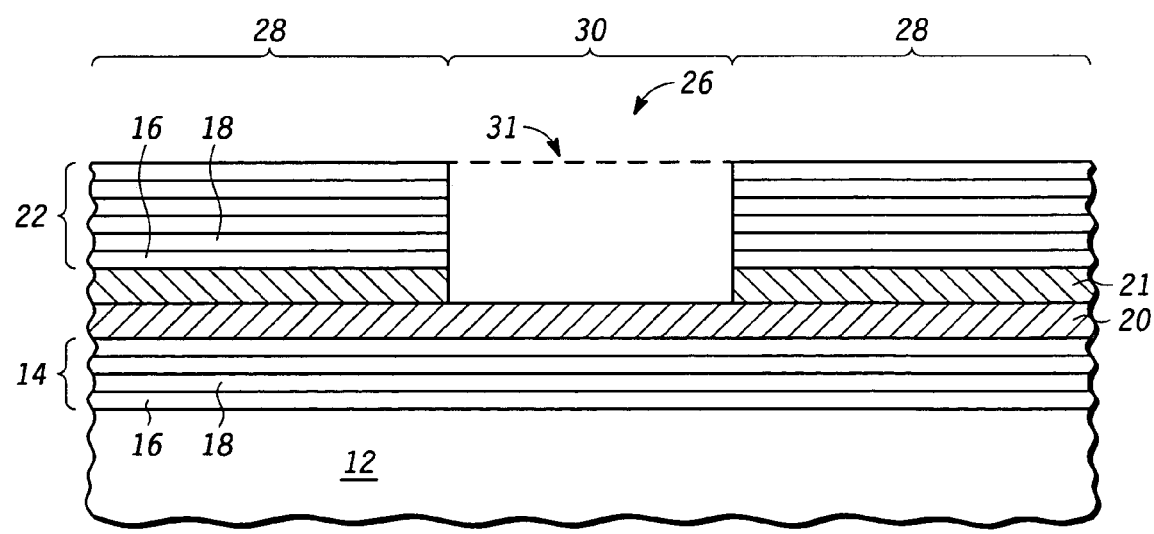
FIG. 5 illustrates the portion of the EUV mask of FIG. 4 after removing a hard mask layer.

Referring to FIG. 5, an etch process is used to remove hardmask 24. In one embodiment where the hardmask 24 is chromium, the hardmask 24 may be removed using a gas including chlorine and oxygen. In one embodiment, a gas ratio of chlorine to oxygen is approximately 5:1, which may vary depending on the etch tool used. The presence of oxygen makes the process selective to chromium so that the top most layer of the upper multilayer reflective stack 22 is not removed. It is speculated that the addition of the oxygen reacts with the top most layer of the upper multilayer reflective stack 22 if it is silicon and forms silicon dioxide that cannot be etched using chlorine. In an alternate embodiment, removing chromium of the hardmask 24 can be done by a wet etch process rather than a dry etch process (e.g., using a gas). Hardmask 24 can alternately be removed using a ceric ammonium nitrate (CAN) solution if hardmask 24 is chromium. A different etch chemistry may be used if hardmask 24 is formed using a different material.

Figure 6:
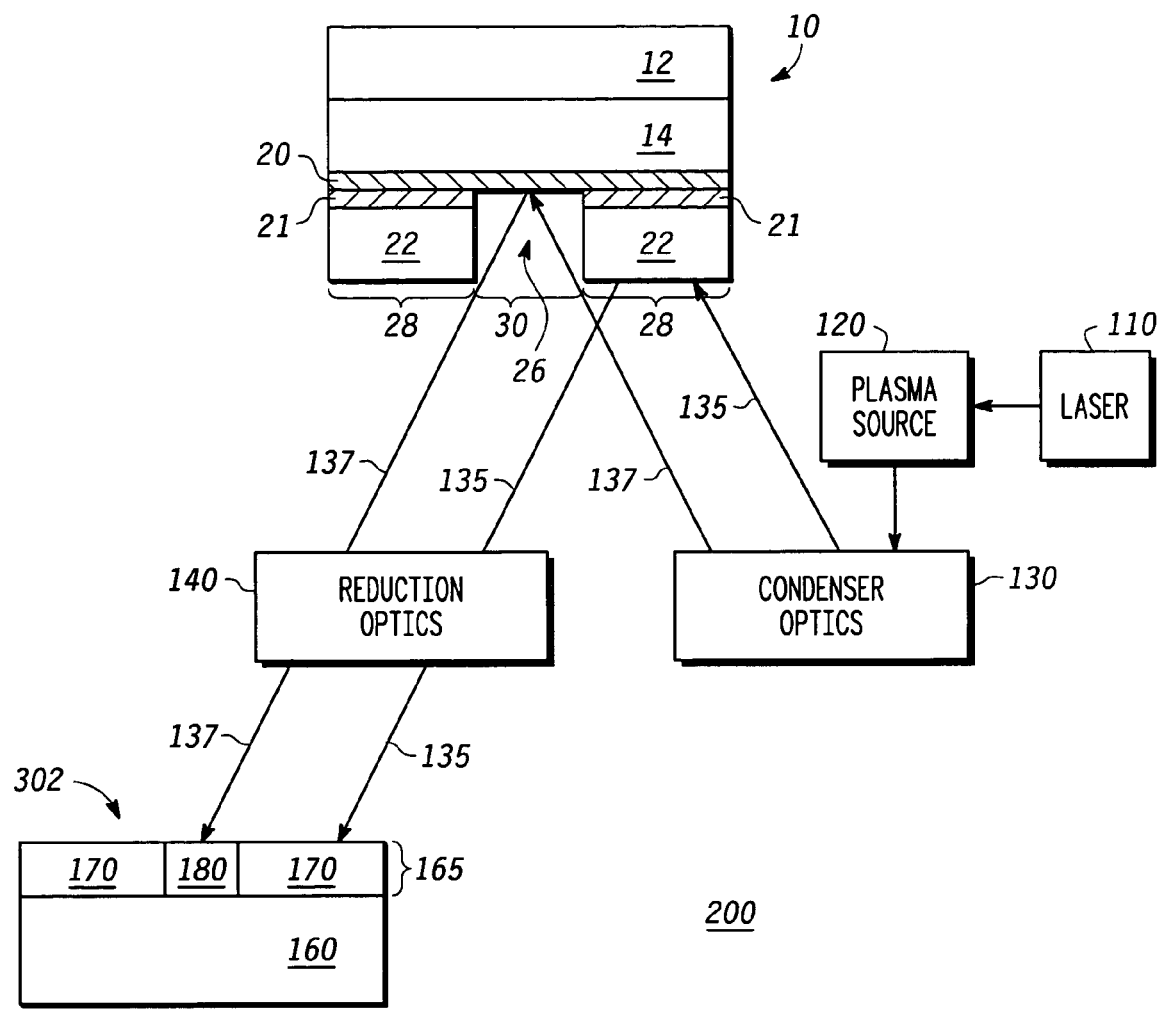
FIG. 6 illustrates using the EUV mask of FIG. 5 to pattern a semiconductor device.

Illustrated in FIG. 6 is an EUV (lithographic) system 200 for using the EUV mask 10 to pattern a semiconductor wafer or device 150. The EUV system 200 includes a laser 110, a plasma source 120, condenser optics 130, the HPSM 10, reduction optics 140 and the semiconductor device 302. From the plasma source 120, radiation with a wavelength in the EUV regime is emitted and focused by the condenser optics 130 into collimated light or radiation 135 and 137. Although a variety of sources can provide EUV radiation, a laser produced plasma source 120 is shown. The source 120 uses a high powered pulsed laser 110, such as Nd:YAG, for activating a supersonic gas jet, such as xenon gas jet. The xenon atomic clusters are heated to high temperatures resulting in the formation of a plasma source 120. The collimated light 135, 137 are projected onto the HPSM 10 at an angle, which is typically approximately 5 degrees with respect to the perpendicular axis of the HPSM 10, and reflected. Before impacting the semiconductor device 302, the reflected light travels through reduction optics 140, which reflect the light in order to shrink the pattern on the HPSM 10. Typically, the reduction optics 140 reduces the pattern on the HPSM 10 by four or five times. From the reduction optics 140, the light 135 and 137 illuminates a photoresist layer 165 formed over a semiconductor substrate 160.

The collimated light 135 is projected onto the mask 10 at an angle, which is typically approximately 5 degrees with respect to the perpendicular axis of the mask 10, and reflected. The light intensity from the dark region 30 should be almost the same as that from the bright regions 28. (Hence, the dark region 30 and the bright regions 28 are more suitable called the etched stack region 30 and the unetched stack regions 28 in the embodiment where the EUV mask is the HPSM.) In addition, the etched stack region 30 and the unetched stack regions 28 should be designed so that the light reflected off of both regions is 180 degrees out of phase with each other. This means that both the unetched stack regions 28 and the etched stack regions 30 reflect most of the light from the source while the phase shift between the two regions, 28 and 30 causes no reflection at the edge between the unetched stack region 28 and the etched stack region 30 due to interference.

The reflected light travels through reduction optics 140, which reflect the light in order to shrink the pattern on the mask 10. Typically, the reduction optics 140 reduces the pattern on the mask 10 by four or five times. From the reduction optics 140, the light 135 and 137 illuminates a photoresist layer 165 on the semiconductor device 302. The semiconductor device 302 includes the photoresist layer 165 and a semiconductor substrate 160, which is preferably monocrystalline silicon, but can be any other semiconductor material such as gallium arsenide, germanium, or the like. The semiconductor substrate 160 may have any number of layers or structures formed within the semiconductor substrate 160 or under the photoresist layer 165. If the photoresist layer 165 is positive, both the phase shifted light 137 and the non phase-shifted light 135 will expose areas 180 and 170 respectively while forming a non exposed area 175 between the two exposed areas, 180 and 170, by the destructive interference of incoming light hitting the edge between the unetched stack region 28 and the etched stack region 30. If negative photoresist is used, the opposite scenario will occur.

In another embodiment of HPSM 10 where the width of region 30 is larger than the embodiment described above and the photoresist layer 165 is positive, the phase shifted light 137 and the non phase-shifted light 135 will destructively interfere causing a dark region to be formed between regions 170 and 180. No interference of light 137 and 135 will occur in most portions of regions 170 and 180; therefore, most portions of both regions 170 and 180 will be bright, but a dark, non-exposed band will be formed between the transition between each region 170 and region 180. If negative photoresist is used, the opposite scenario will occur. This embodiment is useful for forming small isolated or widely spaced lines in photoresist 165. An optional second mask exposure (not shown) may be used to remove unwanted lines formed in the transition between regions 170 and 180.

For one embodiment, a HPSM absorber layer (not shown) may be formed and patterned over the unetched stack regions 28 to remove unwanted phase shift artifacts or to print large dark regions. This HPSM absorber layer is formed over the unetched stack regions 28 to achieve the desired opacity of the HPSM. For example, the HPSM absorber layer reflects less than 0.5% of incident EUV radiation intensity. The HPSM absorber layer formed over the unetched stack regions 28 of the combined reflective stack 14 and 22 is preferably vacuum compatible, stable with EUV radiation, thermally conductive, and has an emissivity substantially matched with the combined reflective stack 14 and 22. In one embodiment, the HPSM absorber layer includes tantalum, tantalum silicon, tantalum nitride, tantalum silicon nitride, chromium, chromium nitride, and chromium oxynitride. For most of the candidate materials, about 60-80 nm is the optimum thickness for the HPSM absorber layer. Optionally, a repair buffer layer (not shown) (e.g., silicon oxynitride) and a HPSM etch stop layer (e.g., chromium) can be formed under the HPSM absorber layer and over the combined reflective stack 14 and 22 to reduce damage to the combined reflective stack 22 and 14 when patterning the HPSM absorber layer, repair buffer layer, and HPSM etch stop layer.

Additionally, an antireflective coating (ARC) layer (not shown) (e.g., a dielectric) can be formed over the HPSM absorber (not shown) and patterned to increase contrast during mask inspection. The thickness of the ARC layer on top of the HPSM absorber layer should be optimized for minimum reflection for the wavelengths of the inspection tool, which is currently 365 nm and moving to approximately 250 or approximately 200 nm in the future. The calculation of optimum thickness of the ARC layer is a function of the optical constants of the ARC layer and underlying HPSM absorber layer, which can be obtained by spectroscopic ellipsometry. In a preferred embodiment, about 30 nm of SiON deposited by plasma enhanced chemical vapor deposition (PECVD) is used as the ARC layer over 60 nm of the HPSM absorber layer including TaN. The SiON ARC layer provides excellent ARC performance, a contrast ratio higher than 85% during inspection, and the added benefit of acting as a hard mask during etching of the HPSM absorber layer.

Figure 7:
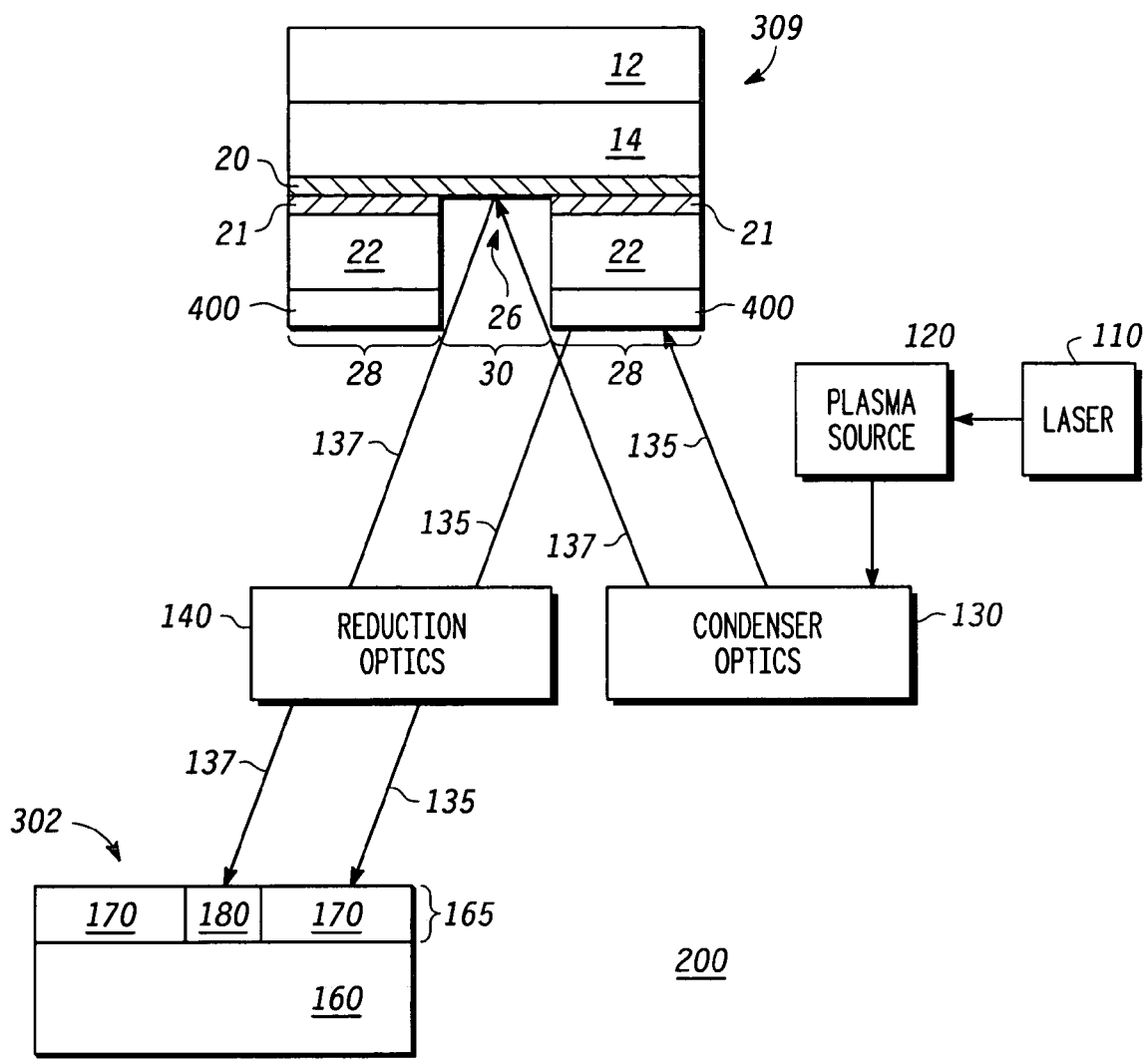
FIG. 7 illustrates using another EUV mask formed in accordance with an embodiment of the present invention to pattern a semiconductor device.

FIG. 7 illustrates using another EUV mask (APSM 309) formed in accordance with one embodiment of the present invention to pattern a semiconductor device. The number of layers in the upper reflective stack 22 for the APSM is determined using the same calculation routine as for the HPSM design. FIG. 7 differs from FIG. 6 in that the mask is an ASPM mask 309 instead of a HPSM mask 10, an ARC layer 400 has been added overlying layer 22 in region 28, and the thicknesses of reflective stacks 14 and 22, EL 20, and EL 21 have been modified for some embodiments.

The thicknesses of the embedded layers (EL) 20 and 21 for the APSM 309 embedded in the combined reflective stack 14 and 22 can be calculated using the same equations as for the HPSM 10. Furthermore, the same materials used for the EL 20 and EL 21 for the HPSM 10 can be used to form the APSM 309. However, the thickness chosen for the EL 20 of the APSM 309 should be chosen taking into account the desired ratio between $R_{30}(\lambda)$ and $R_{28}(\lambda)$, wherein $\lambda$ is the wavelength of radiation of the EUV lithographic process. Additionally, an ARC layer 400 (see FIG. 7) may be chosen to further achieve the desired ratio between $R_{30}(\lambda$ and $R_{28}(\lambda)$. In one embodiment, the number of pairs of layers 16,18 for the lower reflective stack 14 in APSM 309 is the same as for the HPSM 10, preferably 40, to make region 30 a highly reflective region; however, the required number of pairs of layers 16,18 for the upper reflective stack 22 is less than that for the HPSM 10 to make region 28 less reflective than region 30. For some embodiments of the present invention, it is desired that the light 135 that is reflected off of region 28 of APSM 309, as previously discussed, has approximately 5-30 times less intensity than the light 137 that is reflected off of region 30 (i.e. the ratio between $R_{30}(\lambda)$ and $R_{28}(\lambda)$ should be between 5 and 30). The reduction of reflectivity on the dark region 28 can be achieved by the combined effects of the thickness control of EL 20 and 21 for partial destructive interference and attenuation through the ARC layer 400. In addition, the light 135 that reflects off of the dark region 28 is 180 degrees out of phase relative to the light 137 reflected off of the bright regions 30, as designed by optimizing the thickness of the EL 20, and the number of periods in the upper reflective stack 22 and the thickness of the ARC layer 400. For one embodiment of APSM 309, one hundred and eighty (180) degree phase shift can be achieved when 2.3 nm of boron carbide ($B_4C$) is embedded as EL 20 and 6.7 nm of an alloy of nickel and iron is embedded as EL 21 under 6 periods of the upper reflective stack 22; the lower reflective stack 14 has 40 periods; and the ARC layer 400 includes 20 nm of tantalum silicon oxide. In this embodiment, the ratio between $R_{28}(\lambda)$ and $R_{30}(\lambda)$ is 0.19. Alternate embodiments may use any appropriate thicknesses and periods to achieve the desired ratio between $R_{28}(\lambda)$ and $R_{30}(\lambda)$. A second embodiment of APSM 309 results in the ratio between $R_{28}(\lambda$ and $R_{30}(\lambda$ being approximately the reciprocal of the ratio between $R_{28}(\lambda)$ and $R_{30}(\lambda$ that was described in the previous embodiment of APSM 309. In this second embodiment, region 28 is highly reflective (bright) while region 30 has low reflectivity (is dark). In this second embodiment of APSM 309, the number of periods for the lower reflective stack 14 should be smaller than 40 for less reflectivity in region 30, and the thickness of EL 20 is controlled to serve as both an attenuator and an ARC layer for inspection purposes. ARC layer 400 is removed, and the thickness of EL 21 is controlled such that the reflectivity in region 28 remains high. In one embodiment of APSM 309, one hundred and eighty (180) degree phase shift can be achieved when 18.3 nm of tantalum silicon oxide (TaSiO) is embedded as EL 20 and 0.8 nm of an alloy of nickel and iron is embedded as EL 21 under 24 periods of the upper reflective stack 22; the lower reflective stack 14 has 14 periods. In this embodiment, the ratio between $R_{28}(\lambda)$ and $R_{30}(\lambda)$ is 0.26. Alternate embodiments may use any appropriate materials and thicknesses and periods to achieve another desired ratio between $R_{28}(\lambda)$ and $R_{30}(\lambda)$.

Other materials than those described above may be used for the layers on the APSM 309. For example, the lower reflective stack 14 and the upper reflective stack 22 may include a multilayer reflective stack of beryllium and molybdenum or any other layer or layers with suitable reflectivity. Alternatively, the material combination of alternating pairs for the upper reflective stack 22 could be different from that of the lower reflective stack. It is preferable that the materials chosen for the upper reflective stack 22 are more easily etched than those of the bottom reflective stack 14, if different materials are used for the upper reflective stack 22 and the lower reflective stack 14. In addition, a capping layer (not shown) can optionally be formed over the upper reflective stack 22 to protect the materials in the upper reflective stack 22 against oxidation.

The APSM 309 described above generates a pattern on a semiconductor wafer 200 that has a print bias that is close to ideal. The print bias is determined by measuring the width of a feature on a semiconductor wafer after photolithography to form the feature using a tool, such as an scanning electron microscope (SEM) or the like, and subtracting the width of the feature from the desired width of the feature based on design requirements that were used to form the mask used during the photolithographic process. Thus, if a pattern in the APSM 309 is designed to print 40 nm in width and when printed on the semiconductor wafer the pattern is 40 nm, the print bias is ideal or equal to zero. If instead, width of the printed pattern on the semiconductor wafer 200 is 45 nm, the print bias is 5 nm. Print bias can be compensated by changing the width of the patterned regions 28 and 30 on the APSM 309. However, having a small print bias makes the pattern on the APSM 309 easier to fabricate. One way to accommodate for a poor print bias is to decrease the width of patterns; however, this creates smaller structures on the APSM 309, which are harder to manufacture. The advantage of a small print bias (e.g., less than 5 nanometers) is most apparent when the widths of the first area 170 and the second area 180 are nearly the same or when the width of the second area 180 becomes small (e.g., less than 50 nanometers).

Furthermore, a depth of focus improvement of approximately 25 to 75% is achieved when patterning contacts. While all APSMs have a depth of focus improvement, the APSM 309 described herein that has EL 20 as an ARC layer has a more improved depth of focus because etching into the upper reflective layer 22 reduces the diffraction of light that occurs when light travels through a non-reflective layer lying on top of the upper reflective stack 22 and then into the upper reflective stack 22. In addition using the APSM 309 described, aerial image asymmetry due to off-axis illumination is reduced. Furthermore, by using the processing methods described above, the surface of the upper multilayer reflective stack is protected during etching of the opening by an etch mask, thereby decreasing damage of the surface during this process.

In the foregoing specification, the invention has been described with reference to specific embodiments. However, one of ordinary skill in the art appreciates that various modifications and changes can be made without departing from the scope of the present invention as set forth in the claims below. As described above various regions of the APSM and the HPSM are 180 degrees out of phase with each other. In reality, the regions may not be exactly 180 degrees out of phase. However, they will be substantially 180 degrees out of phase with each other. For example, the regions may be 175 or 185 degrees out of phase with each other. Accordingly, the specification and figures are to be regarded in an illustrative rather than a restrictive sense, and all such modifications are intended to be included within the scope of present invention.

Moreover, the terms front, back, top, bottom, over, under and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The term coupled, as used herein, is defined as connected, although not necessarily directly, and not necessarily mechanically. The term program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

The invention claimed is:

1. A method for making a reflective mask useful for transferring a pattern to a semiconductor substrate comprising:
   providing a mask substrate;
   forming a lower multilayer reflective stack over the mask substrate;
   forming a first embedded layer over the lower multilayer reflective stack;
   forming a second embedded layer over the first embedded layer;
   forming a top multilayer reflective stack over the second embedded layer; and
   etching an opening through the top multilayer reflective stack to form an exposed portion of the second embedded layer,
   wherein at least one of attenuation or phase shifting of incident radiation is achieved by way of destructive interference.

2. The method of claim 1, further comprising removing the exposed portion of the second embedded layer.

3. The method of claim 2, wherein removing the exposed portion of the second embedded layer comprises etching the exposed portion of the second embedded layer selective to the first embedded layer.

4. The method of claim 1, wherein etching an opening further comprises forming a defect in the opening.

5. The method of claim 4, further comprising:
   inspecting the reflective mask after etching the opening through the top multilayer reflective stack; and
   removing the defect in the opening.

6. The method of claim 1, wherein forming the first embedded layer comprises forming a layer comprising a material selected from the group consisting of ruthenium, tantalum silicon oxide, boron carbide, hafnium oxide, zirconium oxide, zirconium and silicon oxynitride.

7. The method of claim 1, wherein forming the second embedded layer comprises forming a layer comprising a material selected from the group consisting of chromium, chromium nitride, chromium oxide, hafnium oxide, zirconium oxide, zirconium and nickel iron.

8. The method of claim 1, wherein forming the first embedded layer comprises forming a layer comprising a dielectric.

9. The method of claim 1, wherein forming the first embedded layer and forming the second embedded layer comprise forming a layer comprising a material selected from hafnium oxide, zirconium oxide, tantalum silicon oxide and tantalum oxide.

10. The method of claim 1, further comprising forming a third embedded layer over a second embedded layer.

11. A method for making a reflective mask useful for transferring a pattern to a semiconductor substrate comprising:
    providing a mask substrate;
    forming a lower multilayer reflective stack over the mask substrate;
    forming a first embedded layer over the lower multilayer reflective stack; wherein the first embedded layer comprises a material selected from hafnium oxide, zirconium oxide, and tantalum oxide;
    forming a top multilayer reflective stack over the first embedded layer; and
    etching an opening through the top multilayer reflective stacks,
    wherein at least one of attenuation or phase shifting of incident radiation is achieved by way of destructive interference.

12. The method of claim 11, wherein etching an opening further comprises forming a defect in the opening.

13. The method of claim 12, further comprising:
    inspecting the reflective mask after etching the opening through the top multilayer reflective stack; and
    removing the defect in the opening.

14. The method of claim 11, further comprising forming a second embedded layer over the first embedded layer.

15. The method of claim 14, wherein etching the opening through the top
    multilayer reflective stack forms an exposed portion of the second embedded layer; and
    wherein the method further comprises removing the exposed portion of the second embedded layer.

16. The method of claim 14, wherein forming the second embedded layer comprises forming a layer comprising a material selected from the group consisting of chromium, chromium nitride, chromium oxide, hafnium oxide, zirconium oxide, zirconium and nickel iron.

17. The method of claim 14, further comprising a third embedded layer over the second embedded layer.

18. A method for patterning a photoresist layer on a semiconductor substrate using a reflective mask comprising:
    providing a semiconductor substrate;
    forming a photoresist layer over the semiconductor substrate;
    providing a reflective mask, the reflective mask comprising:
      a mask substrate;
      a lower multilayer reflective stack formed over the mask substrate;
      a top multilayer reflective stack over the lower multilayer reflective stack, wherein the top multilayer reflective stack includes an opening;
      a first embedded layer under the top multilayer reflective stack and exposed in the opening; and
      a second embedded layer under the top multilayer reflective stack;
    projecting incident radiation on the reflective mask,
    wherein at least one of attenuation or phase shifting of the incident radiation is achieved by way of destructive interference;
    reflecting the incident radiation from the reflective mask as reflected radiation; and illuminating the photoresist layer with the reflected radiation.

19. The method of claim 18, the first embedded layer comprises forming a layer comprising a material selected from the group consisting of ruthenium, tantalum silicon oxide, boron carbide, hafnium oxide, zirconium oxide, zirconium and silicon oxynitride.

20. The method of claim 19, wherein the second embedded layer comprises forming a layer comprising a material selected from the group consisting of chromium, chromium nitride, chromium oxide, hafnium oxide, zirconium oxide, zirconium and nickel iron.

21. The method of claim 18, wherein the first embedded layer comprises a dielectric.

22. The method of claim 18, wherein the first embedded layer and the second embedded layer comprise a material selected from the group consisting of hafnium oxide, zirconium oxide, tantalum silicon oxide and tantalum oxide.

23. The method of claim 18, wherein the reflective mask further comprises a third embedded layer over the second embedded layer.

24. A reflective mask comprising:
a mask substrate;
a lower multilayer reflective stack formed over the mask substrate;
a top multilayer reflective stack over the lower multilayer reflective stack, wherein the top multilayer reflective stack includes an opening;
a first embedded layer under the top multilayer reflective stack and exposed in the opening; and
a second embedded layer under the top multilayer reflective stack,
wherein a thickness of the second embedded layer is selected to produce at least one of attenuation or phase shifting of incident radiation by way of destructive interference.

* * * * *

UNITED STATES PATENT AND TRADEMARK OFFICE
CERTIFICATE OF CORRECTION

PATENT NO. : 7,282,307 B2  Page 1 of 1
APPLICATION NO. : 10/872057
DATED : October 16, 2007
INVENTOR(S) : Scott Daniel Hector It is certified that error appears in the above-identified patent and that said Letters Patent is hereby corrected as shown below:

In Column 16, Line 8, Claim No. 11:

Change "stacks," to --stack,--

Signed and Sealed this

Seventeenth Day of June, 2008

JON W. DUDAS
*Director of the United States Patent and Trademark Office*